US007021319B2

(12) United States Patent
Verhaverbeke et al.

(10) Patent No.: US 7,021,319 B2
(45) Date of Patent: Apr. 4, 2006

(54) ASSISTED RINSING IN A SINGLE WAFER CLEANING PROCESS

(75) Inventors: Steven Verhaverbeke, San Francisco, CA (US); J. Kelly Truman, Morgan Hill, CA (US)

(73) Assignee: Applied Materials Inc., Santa Clara, CA (US)

( * ) Notice: Subject to any disclaimer, the term of this patent is extended or adjusted under 35 U.S.C. 154(b) by 297 days.

(21) Appl. No.: 09/892,130

(22) Filed: Jun. 25, 2001

(65) Prior Publication Data

US 2002/0062840 A1 May 30, 2002

Related U.S. Application Data

(60) Provisional application No. 60/214,054, filed on Jun. 26, 2000.

(51) Int. Cl.
*B08B 7/04* (2006.01)
*B08B 7/02* (2006.01)

(52) U.S. Cl. ......................... 134/1.3; 134/1; 134/16.26; 134/30; 134/33; 134/902

(58) Field of Classification Search ................. 134/902, 134/1, 1.3, 19, 26, 30, 33, 34, 2, 3, 32, 36, 134/37

See application file for complete search history.

(56) References Cited

U.S. PATENT DOCUMENTS 5,882,433 A * 3/1999 Ueno .......................... 134/31
6,003,527 A * 12/1999 Netsu et al. ................. 134/1.3
6,247,479 B1 * 6/2001 Taniyama et al. .......... 134/95.2
6,431,184 B1 * 8/2002 Taniyama ................... 134/1.3

FOREIGN PATENT DOCUMENTS

| | | |
|---|---|---|
| DE | 19833197 A1 | 2/1999 |
| EP | 0905747 A1 | 3/1999 |
| JP | 2000058498 | 2/2000 |

OTHER PUBLICATIONS

International Search Report PCT/US 01/42535.

* cited by examiner

*Primary Examiner*—Alexander Markoff
(74) *Attorney, Agent, or Firm*—Blakely Sokoloff Taylor & Zafman

(57) ABSTRACT

The present invention is a method of assisting the rinsing of a wafer in a single wafer cleaning apparatus. According to the present invention, after exposing a wafer to a cleaning and/or etching solution, the cleaning or etching solution is removed from the wafer by spinning the wafer and dispensing or spraying DI water onto the wafer as it is spun. The centrifugal force of the spinning wafer enhances the rinsing of the wafer. In order to enhance the rinsing of the wafer, in an embodiment of the present invention a solution having a lower surface tension than water, such as but not limited to isopropyl alcohol (IPA) is dispensed in liquid or vapor form onto the wafer after the DI water.

In a specific embodiment of the present invention, the vapor of a solution with a lower surface tension than DI water, such as IPA vapor, is blown on the wafer in order to break up the DI water bulging up at the center of the spinning wafer.

In another embodiment of the present invention, a gas such N2, is blown for a short period of time onto the center of the wafer to break up the DI water bulging up at the center of the spinning wafer. In yet another embodiment of the present invention, acoustic or sonic waves are applied to the wafer as it spins in order to help diffuse the DI water from the wafer. And in still yet another embodiment of the present invention, the DI water which is dispensed onto the spinning wafer is heated to a temperature above room temperature and preferably between 60–70° C. to enhance the diffusion of water from the wafer. The low surface tension liquid, acoustic application, gas blowing, and heated DI water can be used alone or in combination with one another into enhance the rinsing of a wafer and thereby decrease the rinsing time of a single wafer process to less than 20 seconds.

12 Claims, 3 Drawing Sheets

ASSISTED RINSING IN A SINGLE WAFER CLEANING PROCESS

This application claims the benefit of provisional application Ser. No. 60/214,054 filed Jun. 26, 2000 entitled ASSISTED RINSING IN A SINGLE WAFER CLEANING PROCESS.

BACKGROUND OF THE INVENTION

1. Field of the Invention

The present invention relates to the field of semiconductor processing more specifically to methods for assisting the rinsing of a wafer in a single wafer cleaning process.

2. Discussion of Related Art

In the fabrication of modern semiconductor integrated circuits (chips) such as microprocessors and memories, there are at least 60 steps which require wet etching or cleaning of a silicon wafer on which the devices are made. Wet etching or wet cleaning of silicon wafers is usually done by immersing a batch of wafers (e.g., 50–100 wafers) into a cleaning liquid such as SC-1 or SC-2 and then rinsing the wafers by immersing in DI water. An immersion batch process is inherently slow since it relies on flow passing along stationery wafers to rinse wafers. Because there is a need for shorter cycle time in chip manufacturing, there is a need for fast single wafer cleaning and rinsing processes.

SUMMARY OF THE INVENTION

The present invention is a method of assisting the rinsing of a wafer in a single wafer cleaning apparatus. According to the present invention, after exposing a wafer to a cleaning and/or etching solution, the cleaning or etching solution is removed from the wafer by spinning the wafer and dispensing or spraying DI water onto the wafer as it is spun. The centrifugal force of the spinning wafer enhances the rinsing of the wafer. In order to enhance the rinsing of the wafer, in an embodiment of the present invention a solution having a lower surface tension than water, such as but not limited to isopropyl alcohol (IPA) is dispensed in liquid or vapor form onto the wafer after chemical dispensing and/or DI water dispensing. In another embodiment of the present invention, a gas such as $N_2$, is blown for a short period of time onto the center of the wafer to break up the DI water bulging up at the center of the spinning wafer. In yet another embodiment of the present invention, acoustic or sonic waves are applied to the wafer as it spins in order to help diffuse the chemicals into the DI water and away from the wafer. And in still yet another embodiment of the present invention, the DI water which is dispensed onto the spinning wafer is heated to a temperature above room temperature and preferably between 6–70° C. to enhance the diffusion of chemicals from the wafer. The low surface tension liquid, acoustic application, gas blowing, and heated DI water can be used alone or in combination with one another into enhance the rinsing of a wafer and thereby decrease the rinsing time of a single wafer process to less than 20 seconds.

DETAILED DESCRIPTION OF THE PRESENT INVENTION

Figure 1A:
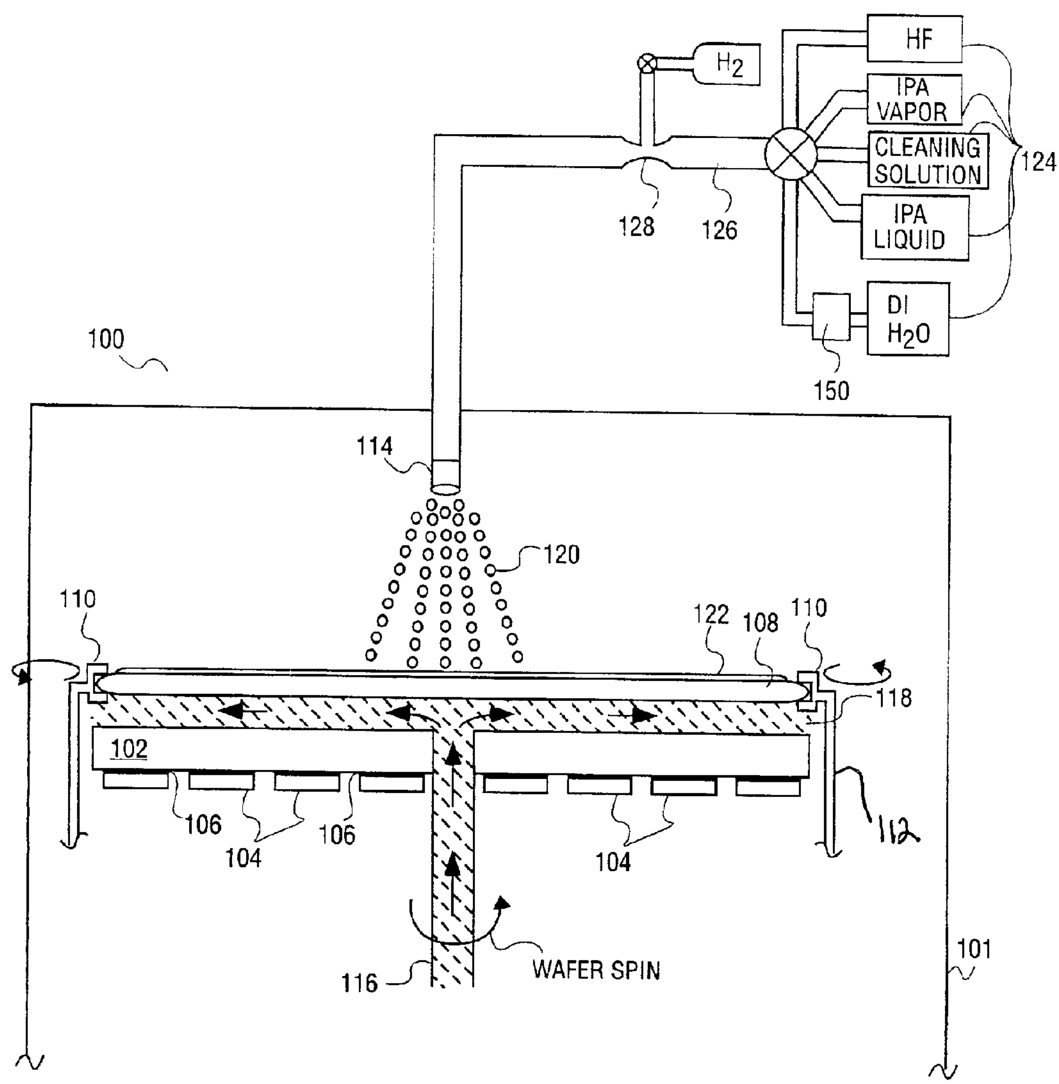
FIG. 1*a* is an illustration of a cross-sectional view of a single wafer cleaning apparatus.

The present invention is a method of assisting the rinsing of a wafer in single wafer cleaning process. In the following description numerous specific details are set forth in order to provide a thorough understanding in the present invention. One of ordinary skill in the art will understand that these specific details are for illustrative purposes only and are not intended to limit the scope of the present invention. Additionally, in other instances well-known processing techniques and equipment have not been set forth in particular detail in order to not unnecessarily obscure the present invention.

The present invention is a method of assisting the rinsing of a wafer in a single wafer cleaning apparatus. According to the present invention, after dispensing a cleaning and/or etching solution onto a spinning wafer, the cleaning or etching solution is removed from the wafer by spinning the wafer and dispensing or spraying DI water onto the wafer as it is spun. The centrifugal force of the spinning wafer enhances the rinsing and drying of the wafer. In order to enhance the rinsing of the wafer even further, in an embodiment of the present invention a solution having a lower surface tension than water, such as but not limited to isopropyl alcohol (IPA) is dispensed in liquid or vapor form onto the wafer after the DI water.

The DI water rinse step is meant to remove the chemicals from the etching and/or cleaning step and replace these chemicals with pure DI water. The removal of the chemicals from the wafer happens through a combination of convection and diffusion. Close to the wafer surface, chemicals are removed by the rinsing DI water by diffusion only. The diffusion rate of chemicals close to the wafer surface is dependent upon the boundary layer thickness. The boundary layer thickness can be made small by spinning the wafer at high rotation rates. In an embodiment of the present invention, the IPA vapor is directed at the wafer surface. The IPA vapor reduces the boundary layer and pushes the remaining chemicals and DI water away from the surface. This is a very efficient way of shortening the rinse.

In another embodiment of the present invention, a gas such $N_2$, is blown for a short period of time onto the center of the wafer to break up the DI water and chemicals bulging up at the center of the spinning wafer. In yet another embodiment of the present invention, acoustic or sonic waves are applied to the wafer as it spins in order to help diffuse the chemicals into the DI water and away from the wafer. And in still yet another embodiment of the present invention, the DI water which is dispensed onto the spinning wafer is heated to a temperature above room temperature and preferably between 60–70° C. to enhance the diffusion of chemicals into the DI water. The low surface tension liquid, acoustic application, gas blowing, and heated DI water can be used alone or in combination with one another into enhance the rinsing of a wafer and thereby decrease the rinsing and drying time of a single wafer process to less than 20 seconds. The IPA vapor or $N_2$ blowing can be done separately or simultaneously with DI water dispensing to speed up the rinse.

Figure 1B:
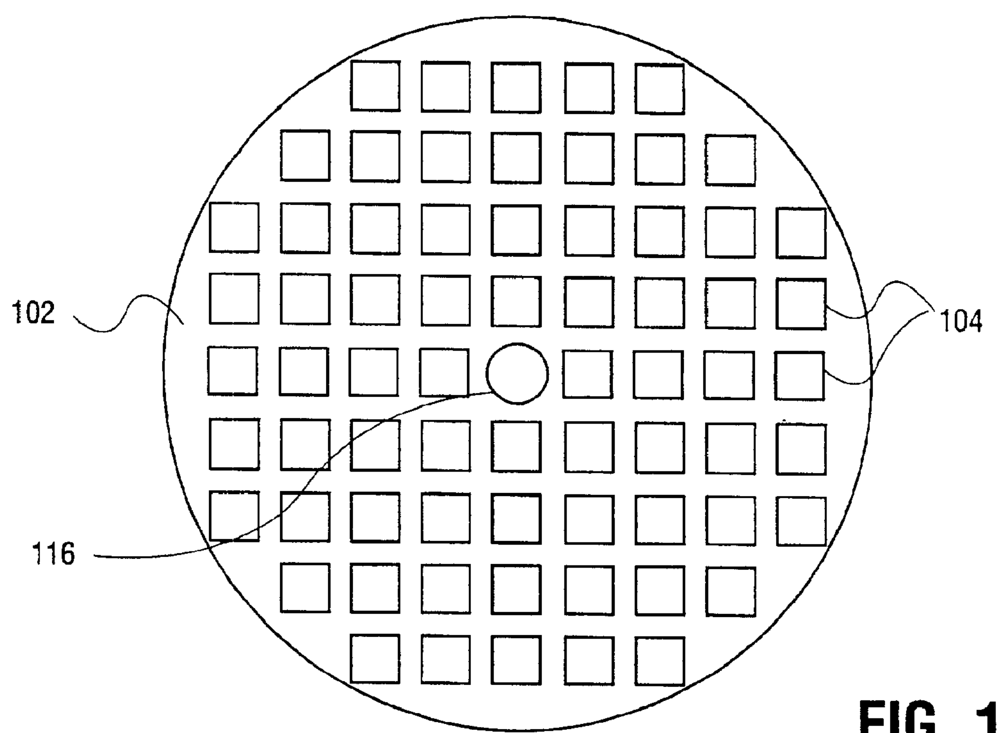
FIG. 1*b* is an illustration showing the covering of the entire surface area of a plate with transducers.

The rinsing process of the present invention is carried out in a single wafer cleaning apparatus which utilizes the centrifugal force of a spinning wafer to enhance the rinsing of the wafer. An example of a single wafer cleaning apparatus which can be used to rinse a wafer in accordance with the present invention as shown in FIG. 1*a*. Single wafer cleaning apparatus 100 shown in FIG. 1*a* includes a plate 102 with a plurality of acoustic or sonic transducers 104 located thereon. Plate 102 is preferably made of aluminum but can be formed of other materials such as but not limited to stainless steel and sapphire. The plate is preferably coated with a corrosion resistant fluoropolymer such as Halar. The transducers 104 are attached to the bottom surface of plate 102 by an epoxy 106. The transducers 104 cover the entire bottom surface of plate 102 as shown in FIG. 1*b*. The transducers 100 preferably generate sonic waves in the frequency range between 400 kHz and 8 MHz. In an embodiment of the present invention the transducers are piezoelectric devices. The transducers 104 create acoustic or sonic waves in a direction perpendicular to the surface of wafer 108.

Figure 1C:
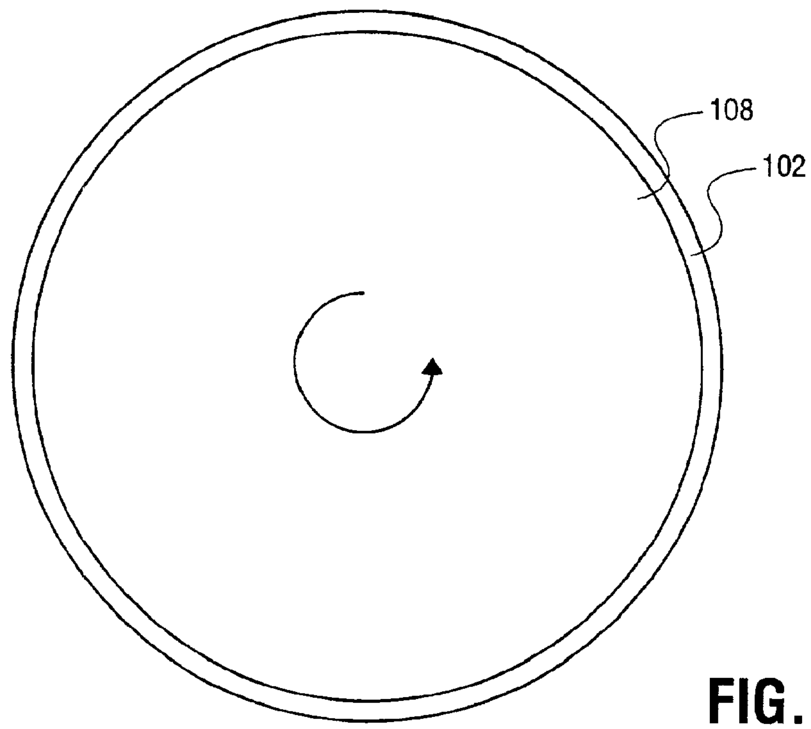
FIG. 1*c* is an illustration showing how the transducers covered plate of FIG. 1*b* covers the entire surface area of a wafer being cleaned.

A substrate or wafer 108 is horizontally held by a wafer support 112 parallel to and spaced-apart from the top surface of plate 102. In an embodiment of the present invention, wafer 108 is held about 3 mm above the surface of plate 102 during cleaning. In an embodiment of the present invention, the wafer 108 is clamped face-up to wafer support 112 by a plurality of clamps 110. Alternatively, the wafer can be supported on elastomeric pads on posts and held in place by gravity. The wafer support 112 can horizontally rotate or spin wafer 108 about its central axis at a rate between 0–6000 rpm. Additionally, in apparatus 100 wafer 108 is placed face up wherein the side of the wafer with patterns or features such as transistors faces towards a nozzle 114 for spraying cleaning chemicals thereon and the backside of the wafer faces plate 102. Additionally, as shown in FIG. 1*c* the transducer covered plate 102 has a substantially same shape as wafer 108 and covers the entire surface area of wafer 108.

During use, DI water (DI-$H_2O$) is fed through a feed through channel 116 and plate 102 and fills the gap between the backside of wafer 108 and plate 102 to provide a water filled gap 118 through which acoustic waves generated by transducers 104 can travel to substrate 108. In an embodiment of the present invention DI water fed between wafer 108 and plate 102 is degassed so that cavitation is reduced in the DI water filled gap 118 where the acoustic waves are strongest thereby reducing potential damage to wafer 108.

Additionally during use, cleaning chemicals and rinsing water such as DI-$H_2O$ are fed through a nozzle 114 to generate a spray 120 of droplets which form a liquid coating 122 on the top surface of wafer 108 while wafer 108 is spun. In the present invention tanks 124 containing cleaning chemicals such as diluted HF, de-ionized water (DI-$H_2O$), cleaning solutions and a low surface tension liquid or vapor, such as, isopropyl alcohol (IPA) are coupled to conduit 126 which feeds nozzle 114. In an embodiment of the present invention the diameter of conduit 126 has a reduced cross-sectional area or a "venturi" 128 in a line before spray nozzle 114 at which point a gas such as $H_2$ is dissolved in the cleaning solution as it travels to nozzle 114. A "venturi" 128 enables a gas to be dissolved into a fluid flow at a gas pressure less than the pressure of the liquid flowing through conduit 126. The venturi 128 creates under pressure locally because of the increase in flow rate at the venturi.

Additionally, if desired, apparatus 100 can include a second nozzle (not shown) separate from nozzle 114 for blowing $N_2$ gas and/or isopropyl alcohol (IPA) vapor onto the frontside of the wafer 108 during rinsing steps. An IPA vapor can be formed by passing $N_2$ gas through a bubbler containing IPA. Such a process will typically produce a vapor of approximately 4% IPA in $N_2$. Additionally, the distance which wafer 108 is held from plate 102 by wafer support 112 can be increased (by moving either support 112 or plate 102) to free the backside of the wafer 108 from liquid filled gap 118 to enable the wafer to be rotated at very high speeds.

In a method of rinsing a wafer 108 in accordance with the present invention using cleaning apparatus 100, a wafer to be rinsed is clamped to wafer support 110. A wafer will typically need to be rinsed after cleaning solutions, such as SC-1 and SC-2 and/or etching solutions such as HF, are applied to the surface of wafer 108. In an embodiment of the present invention wafer 108 is exposed to cleaning chemicals and etching solutions in the same apparatus 100 in which the rinsing takes place (i.e., rinsing is insitu with the cleaning or etching process).

Figure 2A:
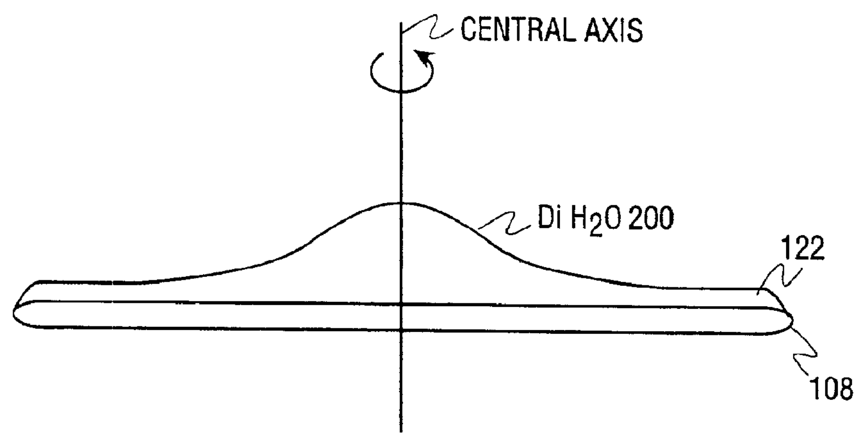
FIG. 2*a* is a schematical profile of rinse water on a spinning wafer.

According to the present invention wafer 108 is rotated about its central axis, preferably at a rate between 500–1000 rpm for hydrophilic wafers and between 50–100 rpm for hydrophobic wafers, while the DI water is dispensed onto its surface through nozzle 114 for rinsing the wafer. At the surface of the wafer, rinsing happens by diffusion. Even when the wafer is spinning at high rotation speeds the rinsing DI water contacting wafer surface moves together with the wafer surface and therefore rinsing happens by diffusion from these contacting layers into the upper layers which do not move relative to the wafer surface. After diffusion into these upper layers the contaminants are swept away. The action of the centrifugal force can thus be understood as creating an infinite sink for diffusion close to the wafer surface and thereby speeds up the rinsing. However, this infinite sink for diffusion is greatly reduced at the center of the wafer. For example, FIG. 2*a* shows the DI water coating profile 122 on wafer 108 as it spins at a high rate. As can been seen in FIG. 2*a*, DI water bulges up 200 in the center of the wafer due to lack of centrifugal force at the center of the wafer due to on axis spinning. The DI-$H_2O$ bulge 200 at the center of the wafer is a result of surface tension. The surface tension holds the DI water together whereas the centrifugal force tends to sheet the water especially towards the edge of the wafer. At the beginning of the rinse the diffusion is very efficient since high concentrations of chemicals is reduced quickly by diffusion into the rinse water. Because diffusion is quick during the initial exposure to the water rinse, the DI water rinse initially is effective by itself in removing contaminants and there is no need initially to remove the bulge 200. DI water provided is good for the initial and vast majority of the rinsing because it has high solubility for ionic contaminants and because it has low cost in liquid consumable cost and a low cost in disposal. In an embodiment of the present invention wafer 108 is exposed to DI water for a period of time between 0–20 seconds.

Figure 2B:
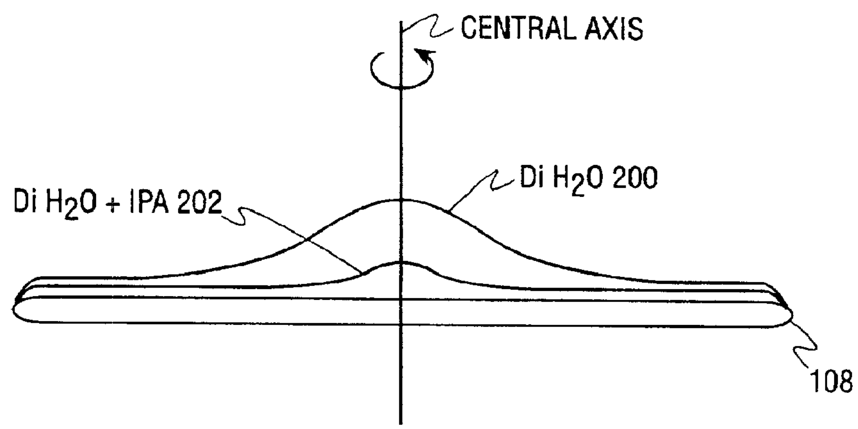
FIG. 2*b* is a schematical comparison between a profile of water while spinning a wafer and the profile of water and IPA on a spinning wafer.
Figure 2C:
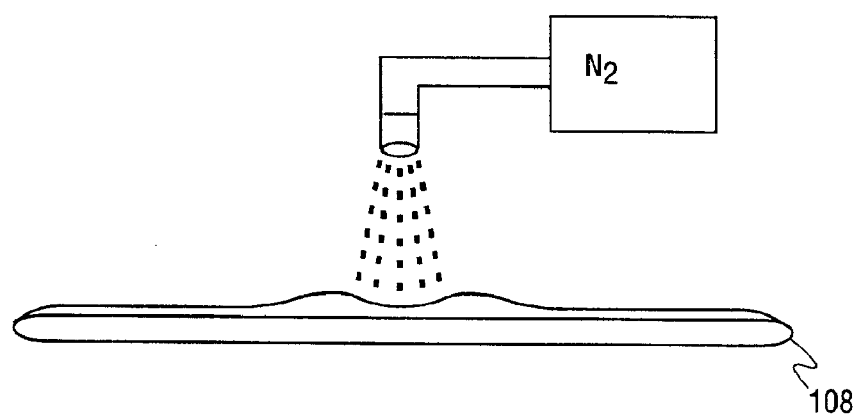
FIG. 2*c* is an illustration showing the blowing of a gas, such as $N_2$, on a water coated spinning wafer.

Unfortunately, however, with time, diffusion slows down and the bulge 200 at the center of the wafer must be reduced. In an embodiment of the present invention the DI water bulge 200 is reduced as shown in FIG. 2*b* by exposing spinning wafer 108 to a rinsing solution with a lower surface tension than water, such as but not limited to isopropyl alcohol (IPA). Exposure to isopropyl alcohol (IPA) is only necessary towards the end of the rinsing cycle and for a short period of time, typically less than 10 seconds, because the initial water rinse is effective by itself and there is no need to reduce the DI-$H_2O$ bulge 200. Additionally, because isopropyl alcohol (IPA) is more expensive than DI water, as is its disposal cost, it is desirable to have the IPA rinse as short as possible in order to reduce its consumption. Additionally, IPA is used at the end of the rinse because although it reduces the bulge 200 and reduces the stationary boundary layer, it has reduced solubility (less than DI water)

for ionic contaminants. Thus, the wafer cleaning process of the present invention therefore uses the best of the both worlds. First a DI water rinse is used which has high solubility for ionic contaminants and which has a low liquid consumable cost. The DI water rinse is followed by a short IPA rinse which has a higher consumable cost. The IPA has a higher disposable cost and has a lower solubility for ionic contaminants but reduces the DI water bulge 200 on the center of the wafer which speeds up the diffusion by reducing the boundary layer.

In an alternative to rinsing with a lower surface tension solution, one can blow the vapor of a low surface tension solution into the center of the wafer. This will also have the effect of reducing bulge 200 and reducing the boundary layer and therefore will have a similar effect in speeding up the rinsing. For example, an IPA vapor will dissolve in the DI water on the wafer surface and will reduce the surface tension. Because of the reduction in surface tension the bulge 200 at the center of the wafer will be reduce much like rinsing with a IPA liquid as shown in FIG. 2*b*. An advantage of using a vapor over a liquid is that vapor is more pure than liquid. A vapor can be easily filtered for particles to a very high purity. A liquid will always contain much more particles. An added advantage of a vapor is that the consumption of the solution can be more easily controlled and this in turn elevates the processing waste processing cost.

In an alternative embodiment of the present invention, one can blow IPA vapor or dispense IPA liquid on the wafer immediately after the chemical dispense step and before DI water is dispensed on the wafer for rinsing. In such a case, the IPA vapor is used to remove the bulk of the chemicals. In yet another embodiment, IPA vapor is blown on the wafer on one spot by one nozzle, simultaneously to or while DI water is dispensed on another spot with another nozzle. In such a way, the IPA vapor lowers the boundary layer locally while the DI water provides the sweeping and convection and sink for the chemicals that are blown sideways by the IPA vapor.

Alternatively, to utilizing a low surface tension liquid to reduce bulge, one can simply blow a gas such as $N_2$ into the center of the wafer to breakdown the bulge by physical force instead of relying upon the reduction of surface tension. Although $N_2$ is a preferred gas other gases such as helium (He) or argon (Ar) can be used to physically breakdown the bulge. Thus according to this embodiment of the present invention the wafer is rinsed first with pure DI water which is then followed by a short blowing of $N_2$ into the center of the wafer to breakdown the bulge of the liquid in the center and thereby increase the rinsing speed.

In an embodiment of the present invention to help improve the rinsing efficiency, acoustic or sonic waves are provided to substrate 108 during the DI water rinse and/or IPA rinse. Acoustic or sonic waves can be provided to substrate 108 by activating transducers 104 which provide acoustic waves which travel through plate 102, water filled gap 118, and through wafer 108 to provide mechanical energy to help improve the diffusion of the DI water on the wafer.

In an embodiment of the present invention the DI water used for rinsing is heated to a temperature greater than room temperature by a heater 150 prior to being sprayed on wafer 108. Heating the DI water used to rinse the wafer provides thermal energy to the DI water which enhances the diffusion. In an embodiment of the present invention the DI water deposited onto the wafer during rinsing is heated to a temperature between 60–70° C.

Thus, several different methods for assisting the rinsing and drying of a wafer in a single wafer process have been described. The different methods can be used alone or combination with one another to enhance the rinsing of a wafer in a single wafer process and thereby reduce the required rinsing time.

After the rinsing process of the present invention, another chemical etch/clean step can follow or the wafer can be dried. Drying can be done by ramping the wafer up to high speed and using the air flow around the wafer to dry the wafer. Alternatively, $N_2$ can be blown on the wafer surface. Typically, the wafer rotation rate for drying will be higher than the wafer rotation rate for rinsing. During drying, hydrophilic wafers can be rotated at a rate between 1000–2000 rpm while hydrophobic wafer can be rotated at a rate between 500–1000 rpm.

Thus, methods for assisting the rinsing of a wafer in a single wafer process have been described.

We claim:

1. A method of rinsing a wafer comprising:

spinning a wafer;

exposing said spinning wafer to DI water while providing sonic waves to substantially the entire surface area of the wafer; and after exposing said spinning wafer to DI water, exposing said spinning wafer to a liquid or vapor having a lower surface tension than water.

2. The method of claim 1 wherein said liquid or vapor comprises isopropyl alcohol (IPA).

3. The method of claim 1 wherein said sonic waves are applied to the backside of said wafer.

4. The method of claim 1 further comprising the step of heating said DI water to a temperature greater than room temperature prior to exposing said spinning wafer to said DI water.

5. The method of claim 1 wherein said wafer is spun at a rate between 50–1000 rpms while exposing said wafer to said DI water and to said liquid or vapor.

6. The method of claim 2 wherein the time of exposure to said liquid or vapor is less than the time of exposure to said DI water.

7. A method of rinsing a wafer comprising:

spinning a wafer;

exposing said spinning wafer to water while providing sonic waves to substantially the entire surface area of the wafer; and after exposing said spinning wafer to water, exposing said spinning wafer to a liquid or vapor having a lower surface tension than water.

8. The method of claim 7 wherein said liquid or vapor comprises isopropyl alcohol (IPA).

9. The method of claim 7 wherein said sonic waves are applied to the backside of said wafer.

10. The method of claim 7 further comprising the step of heating said water to a temperature greater than room temperature prior to exposing said spinning wafer to said water.

11. The method of claim 7 wherein said wafer is spun at a rate between 50–1000 rpms while exposing said wafer to said water and to said liquid or vapor.

12. The method of claim 8 wherein the time of exposure to said liquid or vapor is less the than time of exposure to said water.

* * * * *